United States Patent [19]

Taylor et al.

[11] Patent Number: 5,420,420

[45] Date of Patent: May 30, 1995

[54] INFRARED DETECTOR

[75] Inventors: Stanley Taylor, Sunbury-on-Thames; Alastair Sibbald, Maidenhead, both of England; Stephen D. Etienne, Colombier, Switzerland; Elvin L. Nix, London, England

[73] Assignee: Central Research Laboratories Ltd., Middlesex, United Kingdom

[21] Appl. No.: 181,121

[22] Filed: Jan. 13, 1994

[30] Foreign Application Priority Data

Jan. 21, 1993 [GB] United Kingdom ............... 9301147

[51] Int. Cl.⁶ .................................. G01J 5/14
[52] U.S. Cl. ........................... 250/338.3; 250/332
[58] Field of Search ............. 250/338.3, 338.2, 332, 250/349

[56] References Cited

U.S. PATENT DOCUMENTS 4,945,240  7/1990  Nix et al. .............. 250/338.3 X
4,996,428  2/1991  Voles ..................... 250/332
5,193,911  3/1993  Nix et al. .............. 250/338.3 X

FOREIGN PATENT DOCUMENTS

0454398A2  10/1991  European Pat. Off. .

Primary Examiner—Constantine Hannaher
Assistant Examiner—Edward J. Glick
Attorney, Agent, or Firm—Keck, Mahin & Cate

[57] ABSTRACT

An infrared detector comprises an array of detector elements (2) of the type having a layer of pyroelectric material (4) sandwiched between upper and lower electrodes (6,8) and separated along each edge by separations (16). The electrical sheet resistance of the upper electrode array (6) is reduced by forming gold rims (24) on the edges of the electrodes (6) around the periphery of each separation (16).

3 Claims, 3 Drawing Sheets

INFRARED DETECTOR

BACKGROUND OF THE INVENTION

This invention relates to an infrared radiation detector device including an array of detector elements comprising an array of interconnected electrodes for exposure to the infrared radiation to be detected, an array of discrete electrodes each connected to signal processing means, and pyroelectric material disposed between the arrays. The invention also relates to a method of manufacturing such a detector.

In such a device, the infrared absorption qualities required of the interconnected electrodes leads to a high sheet resistance (e.g. 377 Ω per square for a layer 15 nm thick). Furthermore it is desirable that the electrodes are thermally isolated from each other which further adds to the electrical resistance.

These requirements conflict with a requirement for adequate electrical conduction between the electrodes and leadout connections at the edges of the array, and also with the desirability of low electrical resistance between the electrodes to limit electrical noise and cross-talk.

EP-A-454398 discloses such a device including a network of further electrodes interspersed between the detector elements of the array. The electrodes are carried by support members disposed in gaps between adjacent elements. It is advantageous that the fill factor of the elements be as high as possible; that is, that the elements of the array each be as large as possible in relation to the gaps therebetween.

SUMMARY OF THE INVENTION

It is an object of this invention to facilitate the achievement of a higher fill factor.

According to one aspect of the present invention, a device as defined in the first paragraph is characterised by further material having a higher electrical conductivity than the interconnected electrodes disposed on and contacting a plurality of the interconnected electrodes at or adjacent at least one edge thereof.

The further material can reduce the inter-pixel electrical resistance, and also the centre-to-edge resistance of the array, without significantly adding to the separation required between the elements. The further material is conveniently disposed on and contacting at least one edge face of each of the plurality of interconnected electrodes, for example by electroplating. Preferably the further material extends around the peripheries of separations between the interconnected electrodes.

EP-A-454398 also discloses a method of manufacturing an infrared radiation detector device, the method comprising: forming an array of discrete electrodes supported on and connected to a substrate for connection to signal processing means; depositing a layer of pyroelectric material thereon; and depositing a layer of electrode material on the pyroelectric material for forming the interconnected electrodes.

According to another aspect of the invention a method of this general kind is characterised by depositing a layer of photoresist on the electrode material and patterning the photoresist by removing it to expose the electrode material where separations between the interconnected electrodes are required; etching away the exposed electrode material; making an electrical contact to the remaining electrode material and immersing it in an electroplating solution to deposit the further material on the exposed edges of the electrode material; and removing the remaining photoresist.

BRIEF DESCRIPTION OF THE DRAWINGS

In order that the present invention may be more readily understood, reference will now be made, by way of example, to the accompanying schematic drawings, in which.

DETAILED DESCRIPTION OF THE PREFERRED EMBODIMENTS

Figure 1:
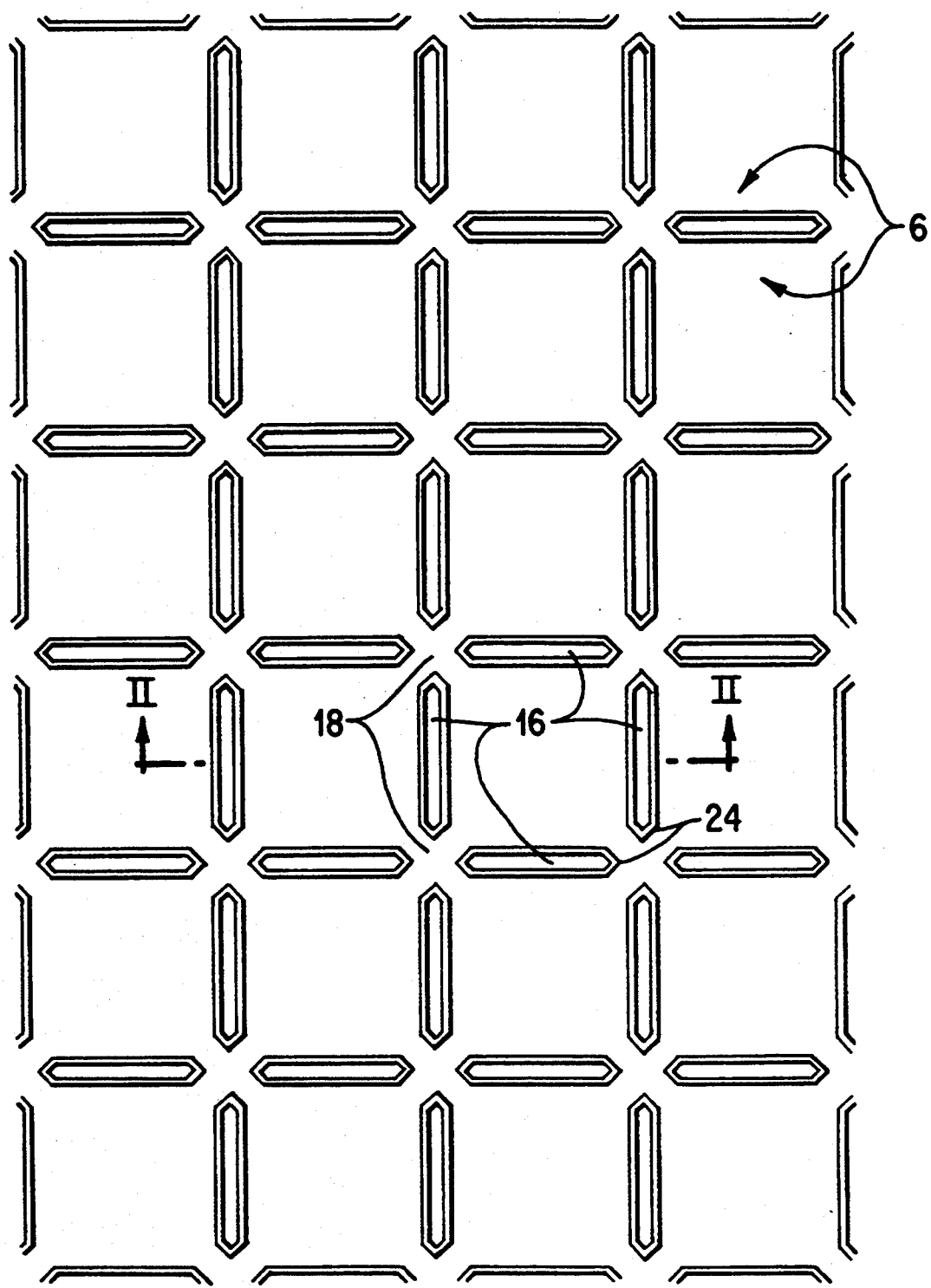
FIG. 1 is a fragmentary plan view of a detector array in accordance with an embodiment of the invention.
Figure 2:
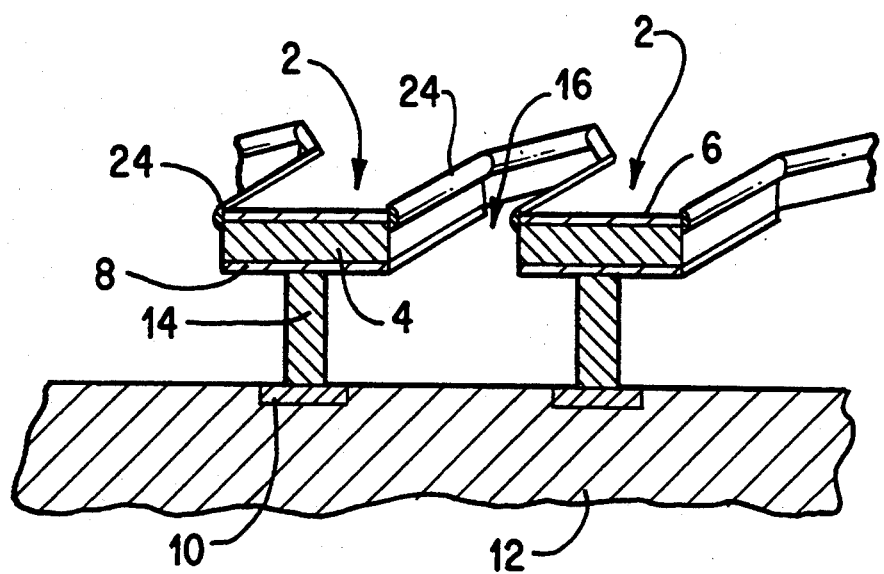
FIG. 2 is a perspective view of the array of FIG. 1 shown partly in cross-section taken along lines II—II; and, FIGS. 3 and 4 are cross-sectional side views of the array during different manufacturing steps.

Referring to FIGS. 1 and 2, an infrared radiation detector device includes an array of detector elements 2. Each element 2 comprises a layer 4 of pyroelectric material sandwiched between an upper electrode 6 for exposure to the infrared radiation to be detected and a lower electrode 8 to form an infrared absorbing structure. The upper electrodes 6 are formed of a metal or alloy having a high sheet resistance so as to provide the structure with good infrared absorption qualities. For example, the upper electrodes may be formed of an alloy of nickel and chromium (NiCr or nichrome).

Each discrete lower electrode 8 is connected to an associated electronic circuit element 10 located on a substrate 12, and thus to a signal processing arrangement (not shown). The connection is made via a supporting pillar 14 for thermally insulating the element 2 from the substrate 12.

The elements 2 are separated along each edge by separations 16, leaving interconnecting pieces 18 at each corner. Further material 24 having a higher electrical conductivity than the material of the electrodes 6 is disposed on the edge faces of the electrodes 6 so as to from a thin conductive rim on adjacent upper electrodes around the periphery of the separations 16.

Figure 3:
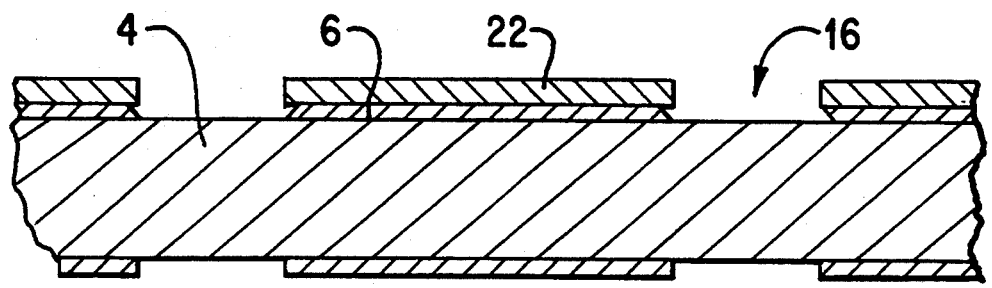
Figure 4:
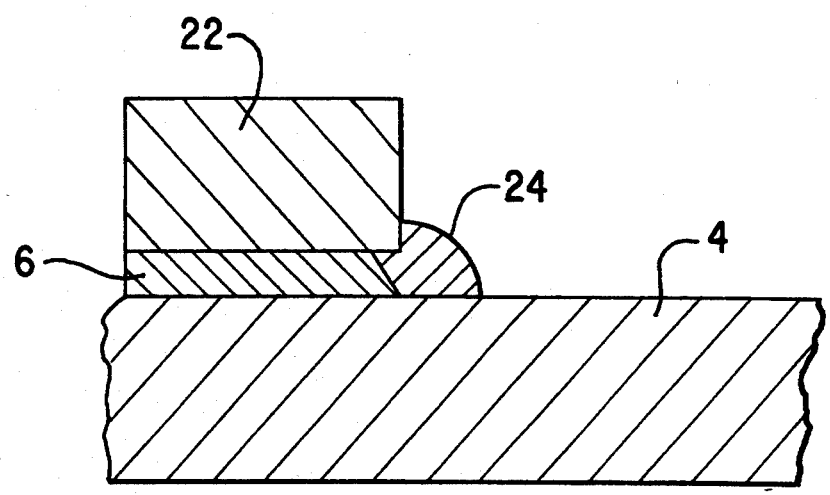

Referring to FIGS. 3 and 4, the lower electrodes 8 and their electrical connections to the substrate 12 via pillars 14 may be framed in the manner described in EP-A-454398, by well-known planar processes. A layer 4 of pyroelectric material and a layer of NiCr for forming the upper electrodes 6 are deposited on the lower electrodes 8 and covered by a layer 22 of photoresist. The photoresist is patterned in accordance with the required shape of the elements 2, and a NiCr etch is then used to remove the unwanted material.

An electrical contact is made to the NiCr layer 6, and the assembly is immersed in an electroplating solution. The electroplating metal 24, for example gold, is deposited only at the exposed edges of the NiCr layer 6 because of the masking effect of the pyroelectric layer 4 and the photoresist 22.

After etching the pyroelectric layer 4 and removing the remaining photoresist the resulting structure is as shown in FIG. 2. A gold rim 24 extends around the separations 16 between the elements, thus significantly reducing interpixel electrical resistance.

Whilst one embodiment of the invention has been described, it will be appreciated that modifications may be made without departing from the scope of the invention as defined by the claims.

For example, the further material may be disposed around only some of the separations, or may be disposed along only some of the edges of each separation. The further material may be disposed on the upper faces of the interconnected electrodes adjacent the edge rather than on the edge faces, for example by appropriate patterning of the photoresist.

We claim:

1. An infrared radiation detector device including an array of detector elements comprising an array of interconnected electrodes for exposure to the infrared radiation to be detected, an array of discrete electrodes each connected to signal processing means, and pyroelectric material disposed between the arrays, characterised by further material being a higher electrical conductivity than the interconnected electrodes disposed on and contacting a plurality of the interconnected electrodes at or adjacent at least one edge of each of the plurality of interconnected electrodes.

2. A device as claimed in claim 1, characterised in that the further material is disposed on and contacting at least one edge face of each of the plurality of interconnected electrodes.

3. A device as claimed in claim 1, characterised in that the further material extends around the peripheries of separations between the plurality of interconnected electrodes.

* * * * *